United States Patent
Stehning et al.

(10) Patent No.: US 9,507,000 B2
(45) Date of Patent: Nov. 29, 2016

(54) **FLOW INSENSITIVE MAGNETIZATION PREPARATION PULSE FOR T2\* CONTRAST**

(75) Inventors: Christian Stehning, Hamburg (DE); Jurgen Erwin Rahmer, Hamburg (DE); Stefanie Remmele, Hamburg (DE); Ulrike Blume, Hamburg (DE); Tobias Richard Schaeffter, London (GB)

(73) Assignee: Koninklijke Philips N.V., Eindhoven (NL)

( * ) Notice: Subject to any disclaimer, the term of this patent is extended or adjusted under 35 U.S.C. 154(b) by 154 days.

(21) Appl. No.: 13/123,128

(22) PCT Filed: Oct. 5, 2009

(86) PCT No.: PCT/IB2009/054338
§ 371 (c)(1),
(2), (4) Date: Apr. 7, 2011

(87) PCT Pub. No.: WO2010/043997
PCT Pub. Date: Apr. 22, 2010

(65) Prior Publication Data
US 2011/0196224 A1    Aug. 11, 2011

(30) Foreign Application Priority Data
Oct. 13, 2008    (EP) .................... 08166452

(51) Int. Cl.
*A61B 5/055* (2006.01)
*G01R 33/50* (2006.01)
(Continued)

(52) U.S. Cl.
CPC ............. *G01R 33/50* (2013.01); *A61B 5/055* (2013.01); *G01R 33/4828* (2013.01); *G01R 33/5602* (2013.01)

(58) Field of Classification Search
CPC combination set(s) only.
See application file for complete search history.

(56) References Cited

U.S. PATENT DOCUMENTS

| | | | |
|---|---|---|---|
| 5,250,898 A | 10/1993 | Hu et al. | |
| 5,655,531 A | 8/1997 | Nishimura et al. | |
| 6,943,033 B2 * | 9/2005 | Van Zijl et al. | 436/173 |

(Continued)

FOREIGN PATENT DOCUMENTS

| | | |
|---|---|---|
| EP | 0496501 | 7/1992 |
| EP | 1136836 | 9/2001 |

OTHER PUBLICATIONS

Sussman et al: "Design Practical T2-Selective RF Excitation (Telex) Pulses"; Magnetic Resonance in Medicine, vol. 40, 1998, pp. 890-899.

(Continued)

*Primary Examiner* — Katherine Fernandez
*Assistant Examiner* — Farshad Negarestan (57) ABSTRACT

A magnetic resonance system comprises a magnetic resonance scanner (10) including a main magnet (12) generating a static magnetic field biasing nuclear spins toward aligning along a direction of the static magnetic field, magnetic field gradient coils (14), a radio frequency coil (16), and a controller (20, 22) configured to: (a) drive the radio frequency coil to selectively tip spins predominantly of short T2\* out of the direction of the static magnetic field; (b) drive at least one of the magnetic field gradient coils and the radio frequency coil to dephase said spins predominantly of short T2\* tipped out of the direction of the static magnetic field; and (c) drive the magnetic field gradient coils and the radio frequency coil to acquire magnetic resonance data that is predominantly T2\* weighted due to preceding operations (a) and (b).

19 Claims, 4 Drawing Sheets

(51) Int. Cl.
    *G01R 33/48* (2006.01)
    *G01R 33/56* (2006.01)

(56) References Cited

U.S. PATENT DOCUMENTS

| 7,064,545 | B2 | 6/2006 | Zaharchuk et al. | |
|---|---|---|---|---|
| 7,247,501 | B2* | 7/2007 | Kim et al. | 436/520 |
| 2006/0135868 | A1* | 6/2006 | Salomon et al. | 600/411 |
| 2007/0145974 | A1 | 6/2007 | Asano | |

OTHER PUBLICATIONS

Denolin et al: "Three-Dimensional Bold fMRI With Spin-Echo Characteristics Using T2 Magnetization Preparation Echo-Planar Readouts"; Magnetic Resonance in Medicine vol. 50, No. 1, 2003, pp. 132-144.
Perman et al: "A Method for Increasing Susceptibility Contrast Weighting for Echo Planar, Snapshot Flash and Spin Echo Imaging"; Book of Abstracts, Society of Magnetic Resonance in Medicine, Ninth Annual Scientific Meeting and Exhibition, 1990, p. 1302.
Brittain et al: "Coronary Angiography With Magnetizzation-Prepared T2 Contrast"; Magnetic Resonance in Medicine, vol. 33. No. 5, May 1996, pp. 689-696.
Hu et al: "A New T2*-Weighting Technique for Magnetic Resonance Imaging"; Magnetic Resonance in Medicine, vol. 30, No. 4, Oct. 1993, pp. 512-517.
Rahmer et al: "Selective 3D Ultrashort TE Imaging:Comparison of Dual-Echo Acquisition and Magnetization Preparation for Improving Short-T2 Contrast"; Magnetic Resonance Materials in Physics, Biology and Medicine, vol. 20, No. 2, Mar. 2007, pp. 83-92.
Stehning et al:"Flow-Sensitive Magnetization Preparation for T2* Contrast"; Proc. Intl. Soc. Mag. Reson. Med., vol. 17, 2009, p. 4455.
Ogawa et al "Oxygenation-Sensitive Contrast in Magnetic Resonance Image of Rodent Brain at High Magnetic Fields" Magnetic Resonance in Medicine 14, (1990) p. 68-78.
Pennell, Dudley "T2* Magnetic Resonance and Myocardial Iron in Thalassemia" Ann. N.Y. Acad. Sci. 1054 p. 373-378 (2005).
Bulte et al "Iron Oxide MR Contrast Agents for Molecular and Cellular Imaging" NMR in Biomedicine, vol. 17 (2004) p. 484-499.

* cited by examiner

FLOW INSENSITIVE MAGNETIZATION PREPARATION PULSE FOR T2* CONTRAST

FIELD OF THE INVENTION

The following relates to the magnetic resonance arts, such as magnetic resonance imaging, magnetic resonance spectroscopy, and so forth.

BACKGROUND OF THE INVENTION

Magnetic resonance (MR) imaging employing T2* weighting is used to provide enhanced contrast in techniques such as blood oxygenation level dependent (BOLD) contrast imaging, iron overload imaging, detection or imaging of superparamagnetic iron oxides (SPIO's) in molecular MR imaging, and so forth. In BOLD imaging, contrast originates from the paramagnetic nature of deoxyhaemoglobin in red blood cells, which perturbs the main magnetic field, leading to a local reduction in main field homogeneity and increased T2* decay (that is, short T2*). Oxygen, on the other hand, effectively shields the paramagnetic haemoglobin, yielding an increased T2*. Thus, a contrast between oxygenated and deoxygenated blood can be obtained by T2* weighted imaging, which elucidates local tissue oxygen consumption.

Various species in a typical biological subject exhibit a range of T2* times. Species with long T2* times are of interest for BOLD and some other T2* weighted imaging techniques. Existing T2* weighted images typically rely upon the enhancement of long T2* contrast by use of long echo time (TE). For example, spoiled gradient echo sequences (SPGR) with long echo times or echo-planar imaging (EPI) methods are used for T2* weighted imaging.

However, these sequences may not provide optimal signal-to-noise ratio (SNR), and are susceptible to flow artifacts due to the long TE. For BOLD imaging of the brain, this may be acceptable due to typically low flow rates in brain tissue. However, for BOLD imaging of regions of faster blood flow, such as cardiac BOLD imaging, flow artifacts can be so pronounced as to prevent successful BOLD imaging.

Accordingly, it would be useful to provide T2* weighting reflective of long T2* species without relying upon long echo times, as is done in existing T2* weighting approaches.

The following provides new and improved apparatuses and methods which overcome the above-referenced problems and others.

SUMMARY OF THE INVENTION

In accordance with one disclosed aspect, a magnetic resonance method is disclosed, comprising: dephasing spins predominantly of short T2* species without substantially dephasing spins of long T2* species; subsequent to the dephasing, performing a magnetic resonance acquisition to acquire magnetic resonance data predominantly from long T2* species; and generating a T2* weighted image from the acquired magnetic resonance data.

In accordance with another disclosed aspect, a storage medium stores instructions executable to perform a magnetic resonance method as set forth in the immediately preceding paragraph. In accordance with another disclosed aspect, a magnetic resonance system is configured to perform a magnetic resonance method as set forth in the immediately preceding paragraph.

In accordance with another disclosed aspect, a magnetic resonance system is disclosed, comprising: a magnetic resonance scanner including a main magnet generating a static main magnetic field biasing nuclear spins toward aligning along a direction of the static main magnetic field; magnetic field gradient coils; a radio frequency coil; and a controller configured to: (a) drive the radio frequency coil to selectively tip spins predominantly of short T2* out of the direction of the main magnetic field; (b) drive at least one of the magnetic field gradient coils and the radio frequency coil to dephase said spins predominantly of short T2* tipped out of the direction of the main magnetic field; and (c) drive the magnetic field gradient coils and the radio frequency coil to acquire magnetic resonance data that is predominantly T2* weighted due to preceding operations (a) and (b).

One advantage resides in enabling T2* weighted imaging without reliance upon imaging sequences having long echo times.

Another advantage resides in reduced flow artifacts in T2* weighted imaging.

Further advantages will be apparent to those of ordinary skill in the art upon reading and understand the following detailed description.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

Corresponding reference numerals when used in the various figures represent corresponding elements in the figures.

DETAILED DESCRIPTION OF EMBODIMENTS

Figure 1:
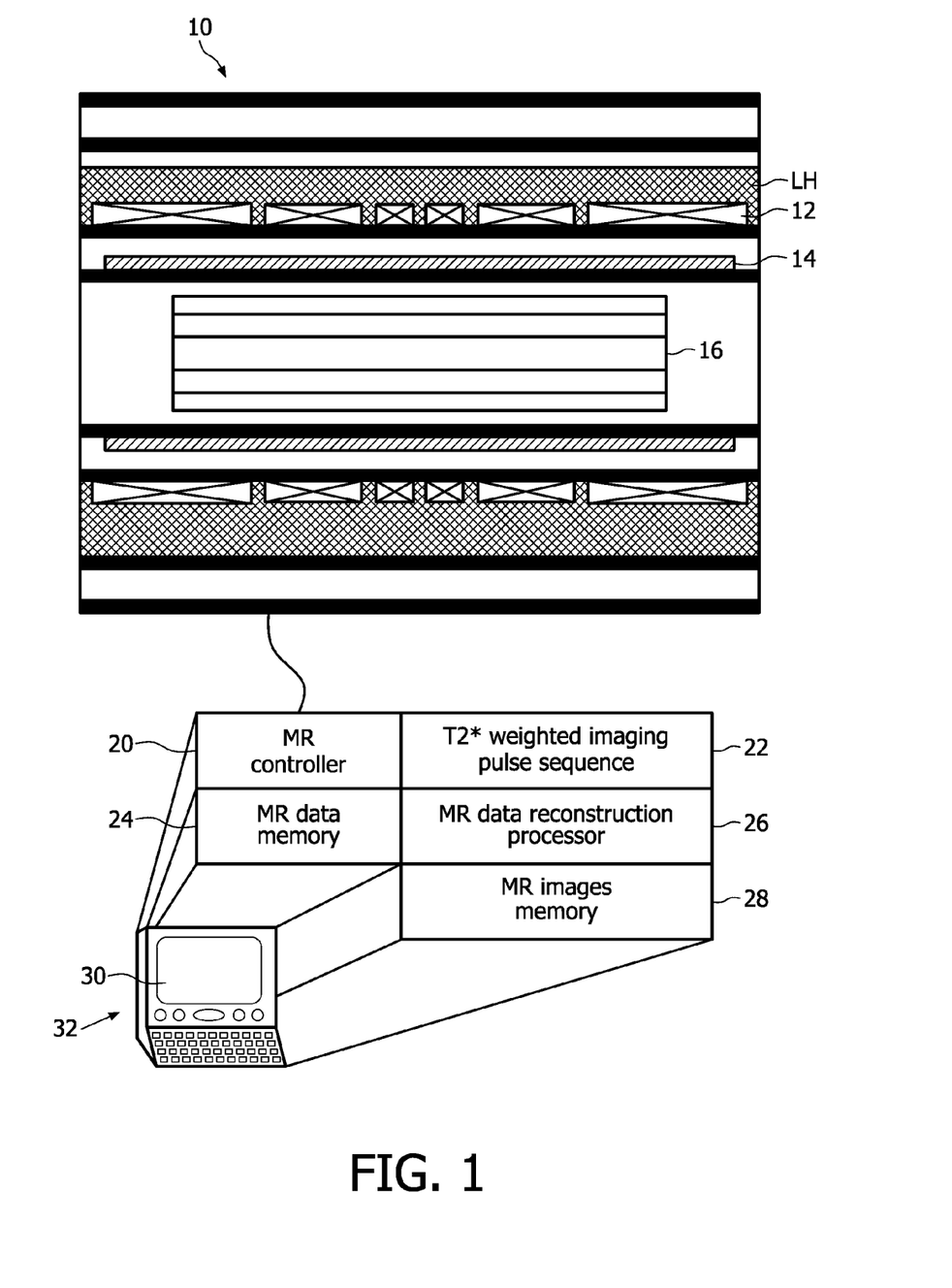
FIG. 1 diagrammatically shows an illustrative magnetic resonance system for T2* weighted imaging.

With reference to FIG. 1, an illustrative magnetic resonance (MR) system includes a magnetic resonance scanner 10 including a main magnet 12 generating a static ($B_0$) magnetic field that is oriented along a first direction. In the case of a bore-type or horizontal magnet system, the first direction is longitudinal in orientation. For ease of understanding, and by way of example, the first direction will henceforth be referred to as the longitudinal direction, corresponding to the horizontal magnet system illustrated in FIG. 1. However, it is to be understood that in case the main magnetic field $B_0$ is oriented in any other direction, e.g., vertical, then the first direction would be taken to mean the direction of the main magnetic field $B_0$. In the illustrated MR system, the static or main magnetic field $B_0$ biases nuclear spins toward aligning along the longitudinal direction. The illustrated main magnet 12 is a superconducting magnet kept at superconducting temperature by immersion in liquid helium LH. The MR scanner 10 further includes magnetic field gradient coils 14 for selectively superimposing magnetic field gradients onto the static $B_0$ magnetic field, for use in spatially encoding or otherwise manipulating magnetic resonance. A radio frequency (RF) coil 16 is energized during an excitation phase to excite magnetic resonance and detects the excited magnetic resonance during a readout phase of a magnetic resonance pulse sequence. In the illustrated embodiment, the single illustrated RF coil 16 is a birdcage coil; however, other types of coils or coil arrays can be used for transmission or receiving. In some embodiments, separate transmit and receive coils or coil arrays are provided. The illustrative MR scanner 10 is a horizontal-bore cylindrical-type scanner; however, the disclosed T2* weighted imaging techniques can be practiced with open MR scanners, vertical MR scanners, or substantially any other type of MR scanner.

The MR scanner 10 is controlled by an MR controller 20 in accordance with a pulse sequence, such as an illustrated T2* weighted pulse sequence 22, to acquire T2* weighted magnetic resonance data that are stored in an MR data memory 24. If the acquired T2* weighted magnetic resonance data are suitably spatially encoded, then an MR data reconstruction processor 26 optionally processes the acquired T2* weighted magnetic resonance data to generate a T2* weighted image from the acquired magnetic resonance. For example, the acquired T2* weighted magnetic resonance data may be spatially encoded using slice-selective gradients applied during the magnetic resonance excitation phase, readout gradients applied during the readout phase, and phase encoding gradient applied between the excitation and readout phases in order to acquire T2* weighted magnetic resonance data in the form of k-space data that are suitably reconstructed by the reconstruction processor 26 using a Fourier Transform based reconstruction algorithm. The generated T2* weighted MR images are suitably stored in an MR images memory 28, displayed on a display 30, or otherwise utilized.

The processing and memory components 20, 22, 24, 26, 28 are suitably embodied as a computer 32 having said display 30, as in the illustrated embodiment, or as another digital processing device such as a network server or so forth. The MR controller 20 configured to implement the T2* weighted pulse sequence 22 is suitably implemented by the computer 32 or another digital processor, or may be embodied as a storage medium such as a magnetic disk, optical disk, random-access memory (RAM), read-only memory (ROM), or so forth storing instructions executable by the computer 32 or another digital processor to cause the MR scanner 10 to perform the T2* weighted pulse sequence 22 to acquire magnetic resonance data. Moreover, although an imaging application is described, the disclosed T2* preparation sequences can be employed for other MR data acquisitions, such as MR spectroscopy.

Figure 2:
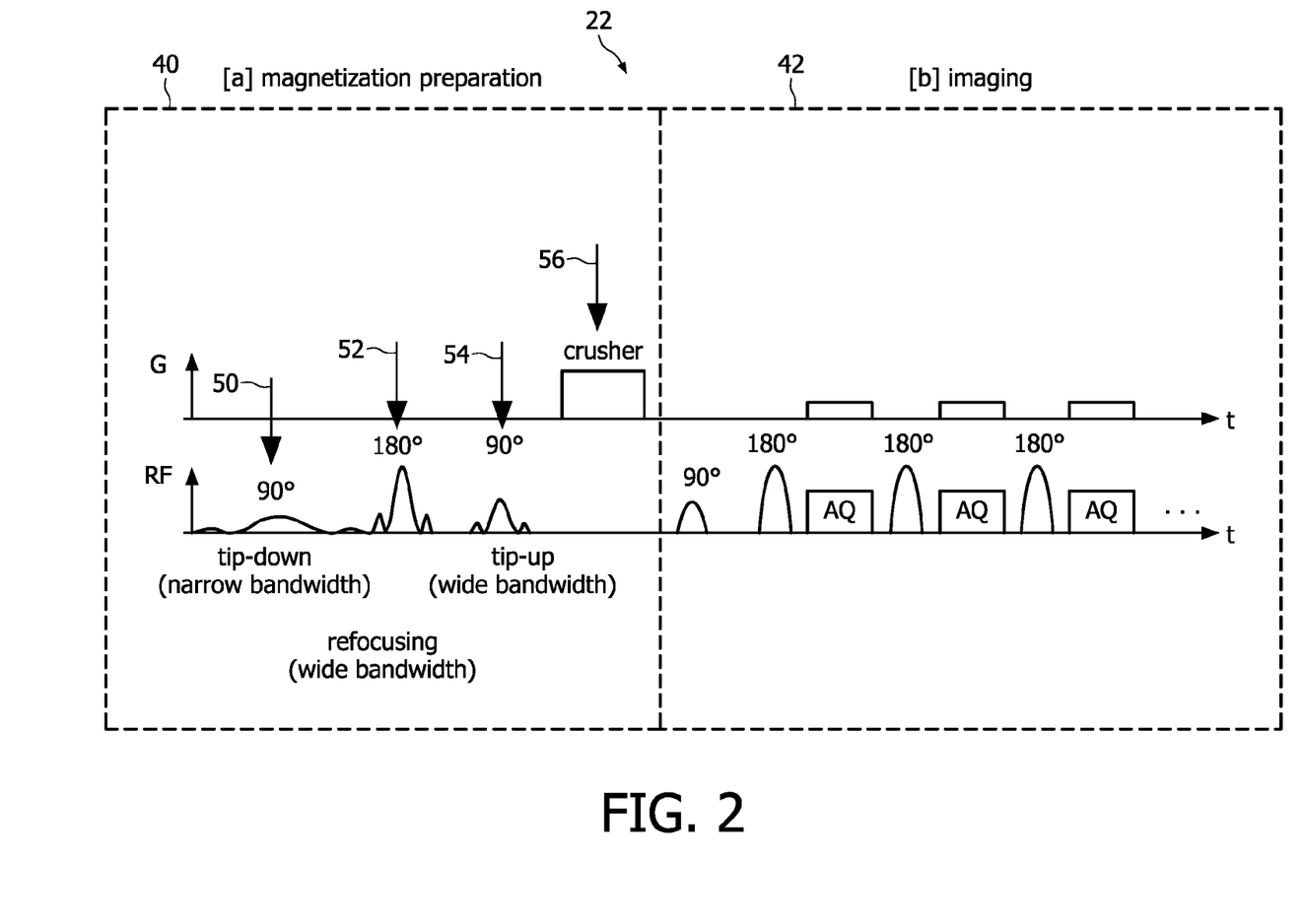
FIG. 2 diagrammatically shows a pulse sequence for performing T2* weighted imaging.

With reference to FIG. 2, an illustrative embodiment of the T2* weighted pulse sequence 22 is described. Some existing T2* weighted pulse sequences operate based on the use of a long echo time, with the objective of allowing T1, T2, and short T2* weighted spins to substantially decay so that the readout signal is strongly T2* weighted based on species having long T2* times. The T2* weighted pulse sequence 22 operates in a fundamentally different fashion, namely by employing a magnetization preparation pulse sub-sequence 40 that dephases spins predominantly of short T2* species without substantially dephasing spins of long T2* species, and following this with substantially any type of MR imaging sequence 42. Since the short T2* species are dephased, the MR imaging sequence 42, regardless of its type, generates a T2* weighted image that is weighed towards long T2* contrast. The magnetization preparation pulse sub-sequence is optionally spatially nonselective, as in the illustrated embodiment of FIG. 2, and the imaging sequence 42 optionally employs a short echo time (that is, short TE), in which case the resulting T2* weighted image is substantially free of flow artifacts.

Figure 3:
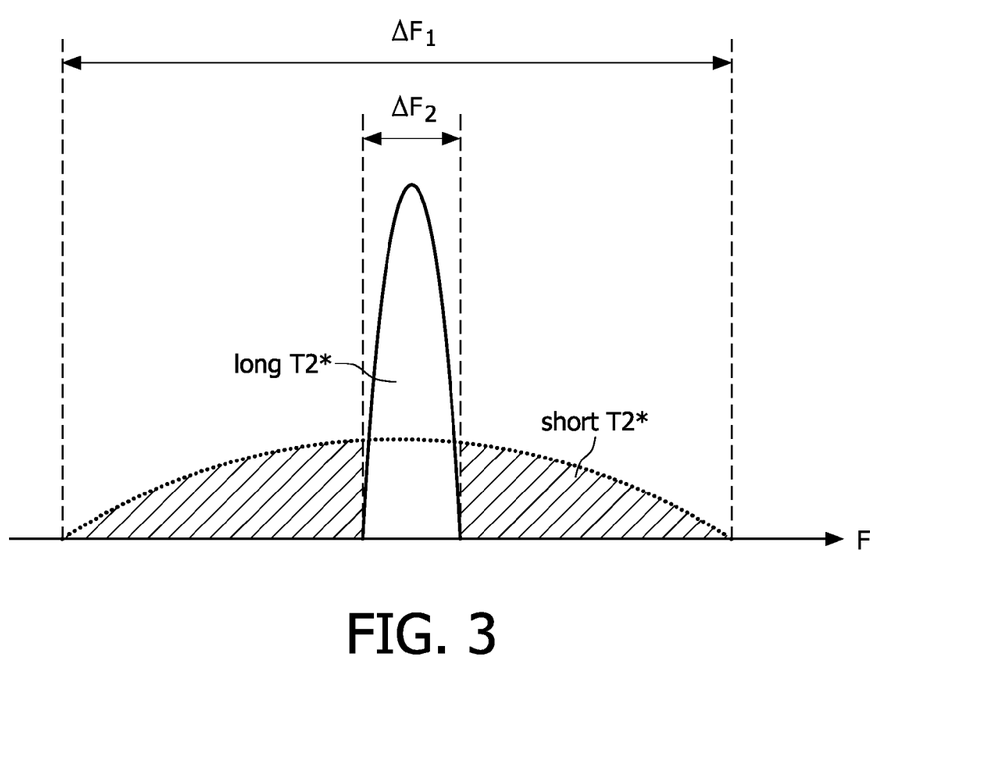
FIG. 3 plots excitation spectra for short T2* species and for long T2* species.

With continuing reference to FIG. 2 and with further reference to FIG. 3, operation of the magnetization preparation pulse sub-sequence 40 that dephases spins predominantly of short T2* species without substantially dephasing spins of long T2* species is based on the observation that short T2* species have substantially broader excitation spectra than do long T2* species, as shown in FIG. 3. (The axis marked F denotes the frequency axis.) As a result, an excitation pulse having a wide bandwidth $\Box F_1$ equal to or larger than the bandwidth of the short T2* species excitation spectrum will manipulate all nuclear species, regardless of whether they have short T2* decay time or long T2* decay time. On the other hand, an excitation pulse having a narrow bandwidth $\Box F_2$ comparable with or smaller than the bandwidth of the long T2* species spectrum will manipulate only the long T2* species. Based on this observation, a combination of narrow bandwidth and wide bandwidth RF pulses can be combined to excite the short T2* nuclear species without exciting the long T2* nuclear species. A magnetic field gradient can then be applied to dephase the excited T2* spins without affecting the long T2* spins. Thereafter, substantially any magnetic resonance imaging pulse sequence can be applied, and it will result in imaging predominated by the long T2* spins but not the dephased short T2* spins.

With particular reference to FIG. 2, the magnetization preparation sequence 40 includes a narrow bandwidth excitation pulse 50. In the present example, an excitation pulse with a tip angle of 90° is selected; other tip angles greater or smaller than 90° are equally possible. For example, in some embodiments the tip angle is in the range 60°-120°, although tip angles outside this range are also contemplated. To achieve a narrow bandwidth, the excitation pulse 50 is suitably of long temporal duration, for example having a duration that is about or larger than the T2* of the short T2* species. The effect of the narrow bandwidth 90° excitation pulse 50 is to tip spins predominantly of long T2* species out of a longitudinal direction, for example to 90° tip angle in the case of the illustrated 90° excitation pulse 50. On the other hand, short T2* species are substantially unaffected by the narrow bandwidth 90° excitation pulse 50. As seen in FIG. 3, there will be a small fraction of short T2* species whose excitation response does fall within the narrow bandwidth of the narrow bandwidth 90° excitation pulse 50; however, the excited spins are predominantly of the long T2* species.

The narrow bandwidth 90° excitation pulse 50 is followed by a wide bandwidth spin refocusing pulse 52. In the present example, a refocusing pulse with a tip angle of 180° is selected; other tip angles greater or smaller than 180° are equally possible. For example, in some embodiments the tip angle is in the range 150°-210°, although tip angles outside this range are also contemplated. To achieve a wide bandwidth, the refocusing pulse 52 is suitably of short temporal duration, for example having has a duration that is shorter than T2* of the short T2* species. The effect of the wide bandwidth 180° spin refocusing pulse 52 is to refocus the spins predominantly of long T2* species that were tipped out of the longitudinal direction by the narrow bandwidth 90° excitation pulse 50. At the same time, short T2* species are also manipulated by the wide bandwidth 180° refocusing pulse 52. The effect is to tip the short T2* species 180° out of the longitudinal direction and into an inverted direction (that is, antiparallel with the longitudinal direction).

If the wide bandwidth 180° refocusing pulse 52 is centered a time interval Δt after the center of the narrow bandwidth 90° excitation pulse 50, then the refocusing effect is centered at a time Δt after the center of the wide bandwidth 180° refocusing pulse 52. In other words, the spins predominantly of long T2* species that were tipped out of the longitudinal direction by the narrow bandwidth 90° excitation pulse 50 are most strongly refocused at time Δt after the center of the wide bandwidth 180° refocusing pulse 52.

At the refocusing time (that is, at time Δt after the center of the wide bandwidth 180° refocusing pulse 52), a wide bandwidth 90° restoring pulse 54 returns the refocused spins predominantly of long T2* species back to the longitudinal direction. Just as the previously described excitation pulse 50, a restoring pulse having a different tip angles than 90° is equally possible. For example, in some embodiments the tip angle is in the range 60°-120°, although tip angles outside this range are also contemplated. Again, the wide bandwidth restoring pulse 54 is suitably of short temporal duration, for example having a duration that is shorter than T2* of the short T2* species, so as to have a sufficiently wide bandwidth to affect both long and short T2* species. Accordingly, the wide bandwidth restoring pulse 54 also manipulates the short T2* species. These short T2* species were inverted (tip angle ~180°) by the wide bandwidth 180° refocusing pulse 52. The 90° restoring pulse 54 therefore imparts a 90° tip angle to the short T2* species.

In summary, the combined effect of the narrow bandwidth 90° excitation pulse 50, the wide bandwidth 180° refocusing pulse 52, and the wide bandwidth restoring pulse 54, is that the long T2* species are predominantly in the longitudinal direction while the short T2* species are predominantly at 90° tip angle, that is, tipped into the transversal plane that is transverse to the longitudinal direction. The pulses 50, 52, 54 are then followed by a crusher magnetic field gradient 56 that dephases or crushes the excited spins, that is, the short T2* species that are predominantly at 90° tip angle. On the other hand, the crusher magnetic field gradient 56 has substantially no effect on the long T2* species that are longitudinally oriented and hence are not excited spins.

To summarize, the T2* contrast preparation pulse sub-sequence 40 includes the long-duration 90° excitation pulse 50 with narrow bandwidth, which tips the magnetization of species with long T2*(narrow spectrum, see FIG. 3) into the transversal plane. Next, the short 180° refocusing pulse 52 with wide bandwidth refocuses magnetization of these predominantly long T2* species, and inverts the other (predominantly short T2*) species. The 90° restoring RF pulse 54 with wide bandwidth restores the refocused magnetization of species predominantly with long T2* to the longitudinal direction, while the inverted magnetization of species with predominantly short T2* is tipped into the transversal plane and spoiled by the gradient spoiler 56. The illustrative pulse sequence 50, 52, 54, 56 ensures that predominantly species with long T2* are available for imaging, while species with short T2* are effectively suppressed. As a result, the succeeding imaging pulse sub-sequence 42 yields a strong T2* contrast. This is true even if the succeeding imaging pulse sub-sequence 42 does not have a long echo time (that is, even if the imaging pulse sub-sequence 42 has short TE). The strong T2* contrast is achieved not by using a long TE, but rather by effectively suppressing species with short T2*. (However, it is also contemplated for the imaging pulse sub-sequence 42 to have a long TE, in which case strong T2* contrast is provided both by the preparation sub-sequence 40 and by the long TE).

Advantageously, the magnetization preparation sub-sequence 40 is not spatially selective, that is, no slice selection gradients are employed. As a result, the short T2* species are suppressed in the whole excitation volume, rather than only in a selected slice, which substantially suppresses or eliminates flow artifacts even in regions of fast blood flow such as the cardiac region. Because the preparation sub-sequence 40 provides the T2* contrast, the following imaging sequence 42 used to collect magnetic resonance imaging data can be of substantially any type. For example, the MR imaging sub-sequence 42 can be a selected fast MR sequence with optimal SNR and low susceptibility to flow artifacts as may be appropriate for a selected application.

In one example, the imaging sub-sequence 42 may have a short echo time effective to provide predominantly proton density weighted imaging in the absence of the short T2* dephasing provided by the preparatory sequence 40. When used in conjunction with the preparatory sequence 40, that same imaging sequence provides a T2* weighted image, rather than a proton density weighted image. This is a consequence of the suppression of short T2* species by the magnetization preparation sub-sequence 40.

The narrow bandwidth or wide bandwidth of the RF pulses 50, 52, 54 can be achieved by adjusting pulse duration. Typically, it is desired for a ratio of the wide bandwidth to the narrow bandwidth to be at least about two, which reflects the typical ratio between the wide bandwidth of the short T2* spectrum and the narrow bandwidth of the long T2* spectrum diagrammatically shown in FIG. 3.

The sequence of RF pulses 50, 52, 54 shown in FIG. 2 is advantageous in that it uses spin refocusing to keep the excited spins of predominantly long T2* species well-focused at the time the restoration RF pulse 54 is applied. However, other magnetization preparation sequences are also contemplated for producing the desired final result of preferential excitation of short T2* species over long T2* species. For example, another contemplated preparation sequence is to use the illustrated narrow bandwidth 90° excitation RF pulse 50 to tip predominantly the long T2* species into the transverse plane, and then to follow directly with a wide bandwidth 270° RF pulse which tips the spins of predominantly long T2* species lying in the transverse plane back into the longitudinal direction, while simultaneously tipping the short T2* species from the longitudinal direction into the transverse plane. This sequence can again be followed by the illustrated crusher gradient 56 to spoil or dephase excited spins of predominantly short T2* species. Additionally or alternatively, radio frequency (RF) spoiling applied by the RF coil 16 can be substituted for the spoiling gradient 56 applied by the gradient coils 14.

Figure 4A:
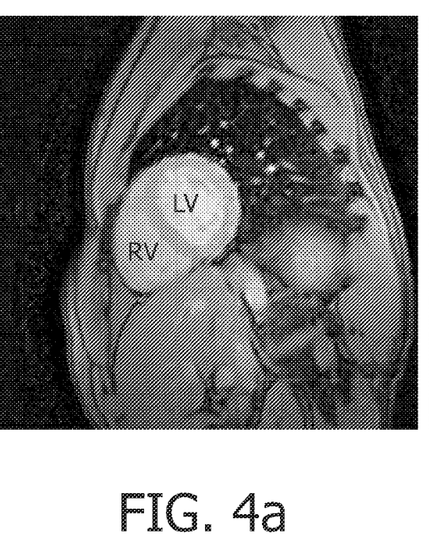
FIG. 4 presents some cardiac imaging results.

With reference to FIG. 4, the combination of the spatially non-selective magnetization preparation sub-sequence 40 with the subsequent imaging sub-sequence 42 having a short TE provides good temporal resolution, and can enable T2* weighted imaging contrast techniques to be employed in situations where heretofore these techniques have not been practical. For example, BOLD imaging of the heart has heretofore been substantially limited by flow artifacts caused by rapid blood flow in the cardiac region. FIG. 4 shows an in vivo example of imaging of a human heart (short axis view). In the leftmost image labeled "[a]" in FIG. 4, a gradient echo sequence was used with a short echo time (TE), and a small flip angle was used for imaging. This provides predominantly proton density weighting. As a result, no contrast between the deoxygenated blood in the right ventricle (labeled "RV" in FIG. 4) and the oxygenated blood in the left ventricle (labeled "LV" in FIG. 4) is observed in the image labeled "[a]".

Figure 4B:
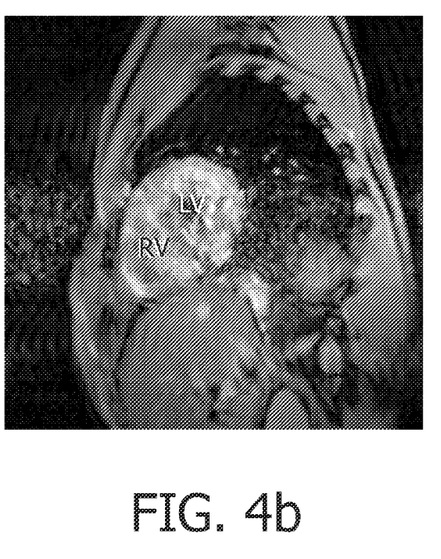

In the middle image of FIG. 4 labeled "[b]", the echo time was increased to TE=15 ms with the aim to provide T2* weighting. However, signal voids in the ventricles and flow artifacts along the phase encoding direction are present as a result of the long TE, yielding undiagnostic image quality.

Figure 4C:
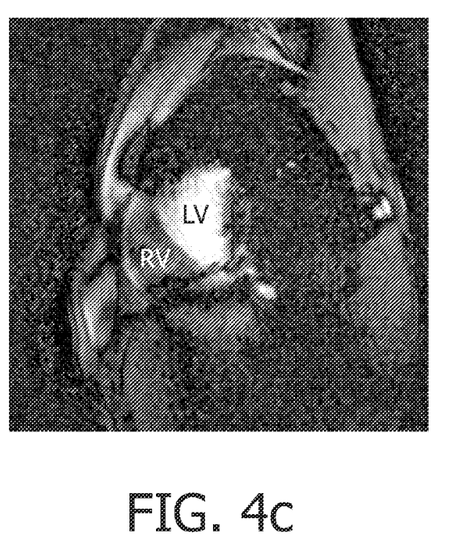

In the rightmost image of FIG. 4 labeled "[c]", the same sequence as used for the leftmost image "[a]" with short TE was employed, but in this case the image acquisition was preceded by the T2* preparation pulse sequence 40 of FIG. 2. The deoxygenated blood in the right ventricle (which has short T2*) appears almost completely suppressed, while the signal from the oxygenated blood in the left ventricle (which has long T2*) is not attenuated. No substantial flow artifacts are observed.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The disclosed embodiments can be implemented by means of hardware comprising several distinct elements, or by means of a combination of hardware and software. In the system claims enumerating several means, several of these means can be embodied by one and the same item of computer readable software or hardware. The mere fact that certain measures are recited in mutually different dependent claims does not indicate that a combination of these measures cannot be used to advantage.

Having thus described the preferred embodiments, the invention is now claimed to be:

1. A magnetic resonance imaging method, comprising:
    controlling a magnetic resonance imaging system to generate a magnetization preparation pulse subsequence, wherein the magnetization preparation pulse subsequence includes:
        a narrow bandwidth excitation pulse having a duration which is longer than a dephasing time T2* of a short T2* species and which tips spins predominantly of long T2* species out of a longitudinal direction of a main magnetic field while predominantly leaving the short T2* species unaffected,
        a wide bandwidth spin refocusing pulse having a duration which is shorter than the dephasing time T2* of the short T2* species and which predominantly refocuses the long T2* species and predominantly inverts spins of the short T2* species, and
        a wide bandwidth restoring pulse having a duration which is shorter than the dephasing time T2* of the short T2* species and which predominantly returns spins of the long T2* species back to the longitudinal direction of the main magnetic field and predominantly tips the spins of the short T2* species out of the longitudinal direction of the main magnetic field,
        wherein the narrow bandwidth excitation pulse, the wide bandwidth spin refocusing pulse, and the wide-bandwidth restoring pulse all have a same center frequency as each other;
    controlling the magnetic resonance imaging system to generate an imaging pulse subsequence to perform magnetic resonance imaging data acquisition following the magnetization preparation pulse subsequence; and
    processing, by the magnetic resonance imaging system, the magnetic resonance imaging data,
    wherein the magnetic resonance imaging data provides blood oxygenation level dependent contrast.

2. The magnetic resonance imaging method of claim 1, wherein the magnetic resonance imaging data acquisition employs a short echo time effective to provide predominantly proton density weighted imaging in the absence of the dephasing.

3. The magnetic resonance imaging method of claim 1, wherein the magnetic resonance imaging data acquisition employs a short echo time that is short compared with T2* of the long T2* species.

4. The magnetic resonance imaging method of claim 1, wherein a ratio of (i) a bandwidth of the wide bandwidth spin refocusing pulse and (ii) a bandwidth of the narrow bandwidth excitation pulse is at least about two.

5. The magnetic resonance imaging method of claim 1, wherein the narrow bandwidth excitation pulse has a 90° flip angle, the wide bandwidth spin refocusing pulse has a 180° flip angle, and the wide bandwidth restoring pulse has a 90° flip angle.

6. The magnetic resonance method of claim 1, wherein the narrow bandwidth excitation pulse has a flip angle of between 60° and 120°, the wide bandwidth spin refocusing pulse has a flip angle of between 150° and 210°, and the wide bandwidth restoring pulse has a flip angle between 60° and 120°.

7. The magnetic resonance imaging method of claim 1, wherein dephasing of the short T2* species is spatially nonselective.

8. The method of claim 1, wherein the magnetization preparation pulse subsequence further includes a spoiler pulse after the narrow bandwidth excitation pulse, the wide bandwidth spin refocusing pulse, and the wide bandwidth restoring pulse, wherein the spoiler pulse dephases the short T2* species spins tipped out of the longitudinal direction of the main magnetic field.

9. The method of claim 8, wherein the spoiler pulse is a crusher gradient pulse.

10. The method of claim 8, wherein the spoiler pulse is an RF pulse.

11. The method of claim 1, wherein a time interval Δt between a center of the narrow bandwidth excitation pulse and a center of the wide bandwidth refocusing pulse equals a time interval Δt between center of the wide bandwidth refocusing pulse and the center of the wide bandwidth restoring pulse.

12. A magnetic resonance imaging system, comprising:
    a magnetic resonance scanner including a main magnet generating a static, main magnetic field biasing nuclear spins toward aligning along a direction of the static main magnetic field;
    magnetic field gradient coils;
    a radio frequency coil; and a controller configured to:
        drive the radio frequency coil to generate a magnetization preparation pulse subsequence including:
            a narrow bandwidth excitation pulse having a duration which is longer than a dephasing time T2* of a short T2* species and which tips spins predominantly of long T2* species out of a longitudinal direction of a main magnetic field while predominantly leaving the short T2* species unaffected,
            a wide bandwidth spin refocusing pulse having a duration which is shorter than the dephasing time T2* of the short T2* species and which predominantly refocuses the long T2* species and predominantly inverts spins of the short T2* species, and a wide bandwidth restoring pulse having a duration which is shorter than the dephasing time T2* of the short T2* species and which predominantly returns spins of the long T2* species back to the longitudinal direction of the main magnetic field and predominantly tips the spins of the short T2* species out of the longitudinal direction of the main magnetic field, wherein the narrow bandwidth excitation pulse, the wide bandwidth spin refocusing pulse, and the wide-bandwidth restoring pulse all have a same center frequency as each other, and drive the magnetic field gradient coils and the radio frequency coil to acquire magnetic resonance data that is predominantly T2* weighted in response to the magnetization preparation pulse subsequence, wherein acquiring the magnetic resonance data that is predominantly T2* weighted provides blood oxygenation level dependent contrast imaging.

13. The magnetic resonance imaging system of claim 12, wherein the controller is further configured to drive the magnetic field gradient coils to apply a spoiler pulse after the narrow bandwidth excitation pulse, the wide-bandwidth spin refocusing pulse, and the wide bandwidth restoring pulse, wherein the spoiler pulse dephases the short T2* species spins tipped out of the longitudinal direction of the main magnetic field.

14. The magnetic resonance imaging system of claim 13, wherein the spoiler pulse is a crusher gradient pulse.

15. The magnetic resonance imaging system of claim 13, wherein the spoiler pulse is a radio frequency pulse.

16. The magnetic resonance imaging system of claim 12, wherein a time interval Δt between a center of the narrow bandwidth excitation pulse and a center of the wide bandwidth refocusing pulse equals a time interval Δt between center of the wide bandwidth refocusing pulse and the center of the wide bandwidth restoring pulse.

17. The magnetic resonance imaging system of claim 12, wherein the narrow bandwidth excitation pulse has a 90° flip angle, the wide bandwidth spin refocusing pulse has a 180° flip angle, and the wide bandwidth restoring pulse has a 90° flip angle.

18. The magnetic resonance imaging system of claim 12, wherein the narrow bandwidth excitation pulse has a flip angle of between 60° and 120°, the wide bandwidth spin refocusing pulse has a flip angle of between 150° and 210°, and the wide bandwidth restoring pulse has a flip angle between 60° and 120°.

19. A magnetic resonance imaging method, comprising:
controlling a magnetic resonance imaging system to generate a magnetization preparation pulse subsequence, wherein the magnetization preparation pulse subsequence includes:
a narrow bandwidth excitation pulse having a duration which is longer than a dephasing time T2* of a short T2* species and which tips spins predominantly of long T2* species out of a longitudinal direction of a main magnetic field while predominantly leaving the short T2* species unaffected,
a wide bandwidth spin refocusing pulse having a duration which is shorter than the dephasing time T2* of the short T2* species and which predominantly refocuses the long T2* species and predominantly inverts spins of the short T2* species, and
a wide bandwidth restoring pulse having a duration which is shorter than the dephasing time T2* of the short T2* species and which predominantly returns spins of the long T2* species back to the longitudinal direction of the main magnetic field and predominantly tips the spins of the short T2* species out of the longitudinal direction of the main magnetic field;
generating, using the magnetic resonance imaging system, an imaging pulse subsequence following the magnetization preparation pulse subsequence;
acquiring, using the magnetic resonance imaging system, magnetic resonance imaging data that is predominantly T2* weighted from a human heart produced in response to the magnetization preparation pulse subsequence and the imaging pulse subsequence; and
processing the acquired magnetic resonance imaging data to provide blood oxygenation level dependent contrast imaging of the human heart.

* * * * *